US012666608B2

(12) United States Patent
  Huang

(10) Patent No.: US 12,666,608 B2
(45) Date of Patent: Jun. 23, 2026

(54) SEMICONDUCTOR STRUCTURE, AND METHOD FOR FORMING SEMICONDUCTOR STRUCTURE

(71) Applicant: CHANGXIN MEMORY TECHNOLOGIES, INC., Hefei City (CN)

(72) Inventor: Meng Huang, Hefei (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 395 days.

(21) Appl. No.: 18/449,018

(22) Filed: Aug. 14, 2023

(65) Prior Publication Data

US 2024/0040777 A1 Feb. 1, 2024

Related U.S. Application Data

(63) Continuation of application No. PCT/CN2023/070663, filed on Jan. 5, 2023.

(30) Foreign Application Priority Data

Jul. 27, 2022 (CN) .......................... 202210888942.2

(51) Int. Cl.
  *H10B 12/00* (2023.01)
(52) U.S. Cl.
  CPC ........... *H10B 12/488* (2023.02); *H10B 12/03* (2023.02); *H10B 12/05* (2023.02); *H10B 12/482* (2023.02)
(58) Field of Classification Search
  CPC ...... H10B 12/488; H10B 12/03; H10B 12/05; H10B 12/482; H10B 12/30
  See application file for complete search history.

(56) References Cited

U.S. PATENT DOCUMENTS 10,535,659 B2  1/2020  Kim
10,861,854 B2  12/2020  Kim
  (Continued)

FOREIGN PATENT DOCUMENTS

CN  109285838 A  1/2019
CN  109616474 A  4/2019
  (Continued)

OTHER PUBLICATIONS

International Search Report in the international application No. PCT/CN2023/070663, mailed on May 11, 2023. 3 Pages.

*Primary Examiner* — Jarrett J Stark
(74) *Attorney, Agent, or Firm* — Syncoda LLC; Feng Ma

(57) ABSTRACT

A semiconductor structure and a method for forming a semiconductor structure are provided. The semiconductor structure includes: a substrate; and a stack structure arranged on the substrate. The stack structure includes storage areas spaced apart from each other in a first direction, and isolation walls, each isolation wall being arranged between any two adjacent storage areas of the storage areas. Each storage area includes memory cells spaced apart from each other in a second direction, each memory cell including a transistor structure, and a capacitor structure, an outline of a projection of the capacitor structure on a top surface of the substrate being in a shape of a rectangle or a rounded rectangle. A width of the transistor structure is equal to a width of the capacitor structure in the first direction, and the transistor structure is aligned with the capacitor structure in the third direction.

18 Claims, 13 Drawing Sheets

(56)      References Cited

U.S. PATENT DOCUMENTS

| | | | | |
|---|---|---|---|---|
| 10,910,378 | B2 | 2/2021 | Lee | |
| 11,011,529 | B2 * | 5/2021 | Ramaswamy | ......... H10B 53/20 |
| 11,094,699 | B1 * | 8/2021 | Brewer | .................. H10B 12/30 |
| 11,361,799 | B2 | 6/2022 | Zhu | |
| 11,569,239 | B2 | 1/2023 | Lee | |
| 11,616,065 | B2 | 3/2023 | Kim | |
| 12,010,827 | B2 * | 6/2024 | Brewer | .................. H10B 12/30 |
| 2019/0006376 | A1 * | 1/2019 | Ramaswamy | ......... H10B 53/20 |
| 2019/0103407 | A1 | 4/2019 | Kim | |
| 2019/0252386 | A1 | 8/2019 | Lee | |
| 2020/0111793 | A1 | 4/2020 | Kim | |
| 2020/0388617 | A1 * | 12/2020 | Ramaswamy | ......... H10B 12/37 |
| 2021/0057416 | A1 | 2/2021 | Kim | |
| 2021/0074334 | A1 | 3/2021 | Zhu | |
| 2021/0143154 | A1 | 5/2021 | Lee | |
| 2021/0375875 | A1 * | 12/2021 | Brewer | .................. H10B 12/30 |
| 2021/0375938 | A1 * | 12/2021 | Lin | ...................... H10D 30/701 |
| 2021/0391330 | A1 | 12/2021 | Zhu | |
| 2022/0122977 | A1 | 4/2022 | Kim | |
| 2025/0024685 | A1 * | 1/2025 | Zhou | ...................... H10B 43/27 |

FOREIGN PATENT DOCUMENTS

| | | | |
|---|---|---|---|
| CN | 110164867 | A | 8/2019 |
| CN | 110800107 | A | 2/2020 |
| CN | 113644061 | A | 11/2021 |
| CN | 113745224 | A | 12/2021 |
| CN | 114023744 | A | 2/2022 |

* cited by examiner

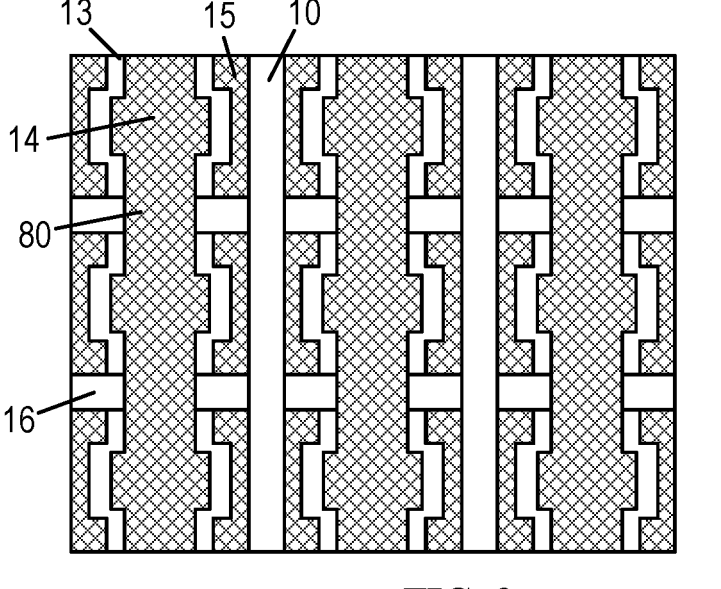

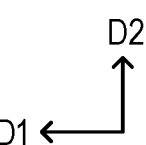

FIG. 9

| providing a substrate | S101 |
| --- | --- |

| forming a stack structure on the substrate, in which the stack structure includes a plurality of storage areas spaced apart from each other in a first direction, and a plurality of isolation walls, each of the plurality of isolation walls being arranged between any two adjacent storage areas of the plurality of storage areas, in which each of the plurality of storage areas includes a plurality of memory cells spaced apart from each other in a second direction, each of the plurality of memory cells including a transistor structure, and a capacitor structure arranged on a side surface of the transistor structure in a third direction and electrically connected to the transistor structure, an outline of a projection of the capacitor structure on a top surface of the substrate being in a shape of a rectangle or a rounded rectangle, a width of the transistor structure being equal to a width of the capacitor structure in the first direction, and the transistor structure being aligned with the capacitor structure in the third direction, and in which each of the first direction and the third direction is parallel to the top surface of the substrate, the second direction is perpendicular to the top surface of the substrate, and the first direction intersects with the third direction | S102 |

FIG. 10

SEMICONDUCTOR STRUCTURE, AND METHOD FOR FORMING SEMICONDUCTOR STRUCTURE

CROSS-REFERENCE TO RELATED APPLICATION

This is a continuation of International Patent Application No. PCT/CN2023/070663, filed on Jan. 5, 2023, which claims priority to Chinese Patent Application No. 202210888942.2, filed on Jul. 27, 2022. The disclosures of International Patent Application No. PCT/CN2023/070663 and Chinese Patent Application No. 202210888942.2 are hereby incorporated by reference in their entireties.

BACKGROUND

A Dynamic Random Access Memory (DRAM) is a semiconductor device commonly used in an electronic device such as a computer, and is composed of a plurality of memory cells. Each memory cell includes a transistor and a capacitor. A gate of the transistor is electrically connected to a word line, a source of the transistor is electrically connected to a bit line, and a drain of the transistor is electrically connected to the capacitor. The word line voltage on the word line can control the transistor to turn on or turn off, such that data information stored in the capacitor can be read through the bit line, or data information can be written into the capacitor through the bit line.

In order to meet the requirements of high storage density and high integration, DRAM and other memory are gradually developed from a two-dimensional structure to a three-dimensional structure. In order to maintain the stability of semiconductor structure with a three-dimensional structure, such as DRAM, it is necessary to provide multiple support frames in the DRAM and to provide multiple lower electrode isolation structures for isolating the adjacent capacitors from each other. For example, in DRAM with a three-dimensional structure, it is usually necessary to provide three support frames (two support frames arranged on opposite sides of the transistor channel region, and one support frame arranged on a side of the capacitor away from the transistor) and two lower electrode isolation structures (arranged at opposite ends of the capacitor). Both the support frames and the lower electrode isolation structures need to occupy space of the semiconductor structure, thereby affecting the further reduction of the dimension of the semiconductor structure. In addition, the dimension of the word line in DRAM is limited by the dimension of the gap between the two support frames, and the support frame will be affected by many accidental factors during formation, so that the dimension of the support frame has a relatively large fluctuation, so as to reduce the controllability of the semiconductor manufacturing process.

Thus, how to reduce the dimension of semiconductor structure and improve the controllability of the semiconductor structure manufacturing process while ensuring the stability of semiconductor structure is an urgent problem to be solved.

SUMMARY

The disclosure relates to the field of semiconductor manufacturing technique, and in particular to a semiconductor structure and a method for forming a semiconductor structure.

According to a first aspect of the disclosure, there is provided a semiconductor structure which includes a substrate and a stack structure.

The stack structure is arranged on the substrate. The stack structure includes a plurality of storage areas spaced apart from each other in a first direction, and a plurality of isolation walls. Each of the plurality of isolation walls is arranged between any two adjacent storage areas of the plurality of storage areas. Each of the plurality of storage areas includes a plurality of memory cells spaced apart from each other in a second direction. Each of the plurality of memory cells includes a transistor structure, and a capacitor structure arranged on a side surface of the transistor structure in a third direction and electrically connected to the transistor structure. An outline of a projection of the capacitor structure on a top surface of the substrate is in a shape of a rectangle or a rounded rectangle. A width of the transistor structure is equal to a width of the capacitor structure in the first direction, and the transistor structure is aligned with the capacitor structure in the third direction. Each of the first direction and the third direction is parallel to the top surface of the substrate, the second direction is perpendicular to the top surface of the substrate, and the first direction intersects with the third direction.

According to a second aspect of the disclosure, there is provided a method for forming a semiconductor structure, which includes the following operations.

A substrate is provided.

A stack structure is formed on the substrate, the stack structure including a plurality of storage areas spaced apart from each other in a first direction, and a plurality of isolation walls, each of the plurality of isolation walls being arranged between any two adjacent storage areas of the plurality of storage areas; in which each of the plurality of storage areas includes a plurality of memory cells spaced apart from each other in a second direction, each of the plurality of memory cells including a transistor structure, and a capacitor structure arranged on a side surface of the transistor structure in a third direction and electrically connected to the transistor structure, an outline of a projection of the capacitor structure on a top surface of the substrate being in a shape of a rectangle or a rounded rectangle, a width of the transistor structure being equal to a width of the capacitor structure in the first direction, and the transistor structure being aligned with the capacitor structure in the third direction, and in which each of the first direction and the third direction is parallel to the top surface of the substrate, the second direction is perpendicular to the top surface of the substrate, and the first direction intersects with the third direction.

BRIEF DESCRIPTION OF THE DRAWINGS

FIG. 9 is another cross-sectional view taken along the b-b position in FIG. 4;

FIG. 10 is a flow chart of a method for forming a semiconductor structure according to a specific embodiment of the disclosure.

DETAILED DESCRIPTION

Hereinafter, specific embodiments of a semiconductor structure and a method for forming the semiconductor structure provided in the disclosure are described in detail with reference to the accompanying drawings.

Figures 1, 2:
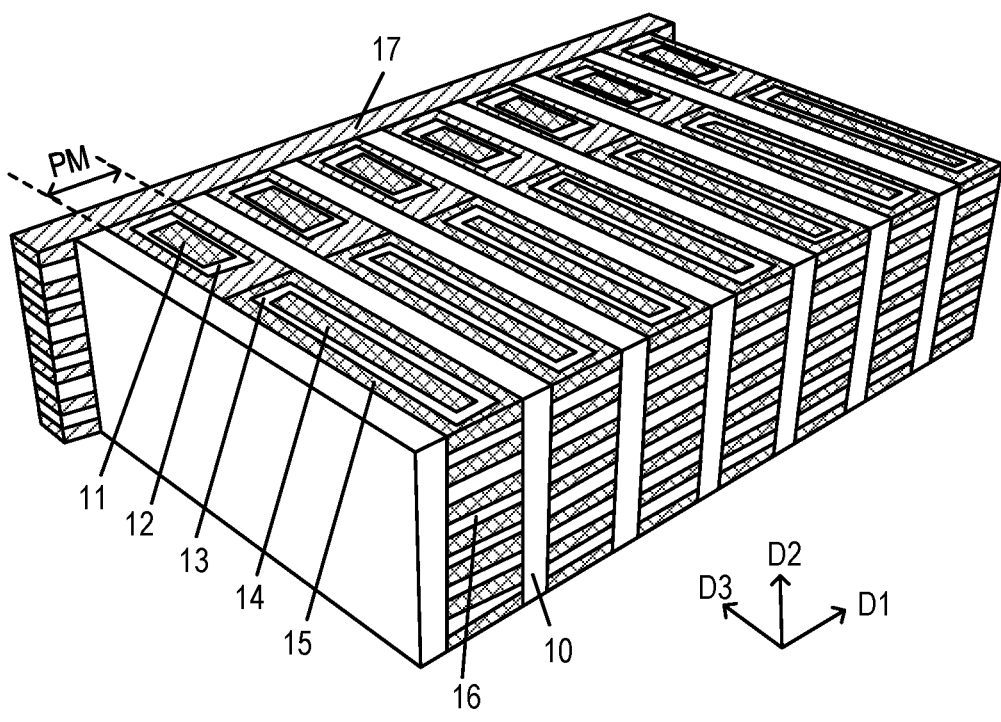
FIG. 1 is a stereoscopic diagram of a semiconductor structure according to a first embodiment of specific embodiments of the disclosure.
FIG. 2 is a top view of FIG. 1.

This specific embodiment provides a semiconductor structure. FIG. 1 is a stereoscopic diagram of a semiconductor structure according to a first embodiment of specific embodiments of the disclosure. FIG. 2 is a top view of FIG. 1. As shown in FIG. 1 and FIG. 2, the semiconductor structure includes a substrate and a stack structure.

The stack structure is arranged on the substrate. The stack structure includes a plurality of storage areas PM spaced apart from each other in a first direction D1, and a plurality of isolation walls 10, each of the plurality of isolation walls 10 being arranged between any two adjacent storage areas of the plurality of storage areas PM. Each of the plurality of storage areas PM includes a plurality of memory cells spaced apart from each other in a second direction D2. Each of the plurality of memory cells includes a transistor structure TR, and a capacitor structure CAP arranged on a side surface of the transistor structure TR in a third direction D3 and electrically connected to the transistor structure TR. An outline of a projection of the capacitor structure CAP on a top surface of the substrate is in a shape of a rectangle or a rounded rectangle. A width of the transistor structure TR is equal to a width of the capacitor structure CAP in the first direction D1, and the transistor structure TR is aligned with the capacitor structure CAP in the third direction D3. Each of the first direction D1 and the third direction D3 is parallel to the top surface of the substrate, the second direction D2 is perpendicular to the top surface of the substrate, and the first direction D1 intersects with the third direction D3.

The semiconductor structure described in this specific embodiment may be, but is not limited to, DRAM. Specifically, the substrate (not shown in the figures) may be, but is not limited to, a silicon substrate. This specific embodiment will be described by taking the substrate being a silicon substrate as an example. In other embodiments, the substrate may also be a semiconductor substrate such as gallium nitride, gallium arsenide, gallium carbide, silicon carbide, or SOI. The substrate is configured to support the stack structure thereon. The top surface of the substrate in this specific embodiment refers to a surface of the substrate facing towards the stack structure. The term "a plurality of" in this specific embodiment means two or more.

The stack structure includes a plurality of storage areas PM and a plurality of isolation walls 10, the plurality of storage areas PM and the plurality of isolation walls 10 being alternately arranged in the first direction D1, and each storage area PM includes a plurality of memory cells spaced apart from each other in the second direction. The storage areas PM which are adjacent to each other in the first direction D1 may be isolated from each other by the isolation wall 10. The plurality of memory cells in the storage area PM are all in contact with and connected to a sidewall of the isolation wall 10, so as to support the plurality of memory cells in the storage area PM by the isolation wall 10, thereby improving the overall stability of the stack structure. Moreover, in this specific embodiment, the stack structure is supported by the isolation wall outside the memory cells, so that there is no need to provide the support structure in the memory cell, which improves the utilization rate of the internal space of the memory cell, thereby further reducing the dimension of the memory cell and improving the storage capacity of the memory cell. In addition, since there is no need to provide the support structure in the memory cell, the influence of the dimension fluctuation of the support structure on the performance of the memory cell is reduced or even avoided, thereby improving the yield of the semiconductor structure, and improving the controllability of the semiconductor structure manufacturing process.

The outline of the projection of the capacitor structure CAP on the top surface of the substrate being in a shape of a rectangle or a rounded rectangle means that a shape of an outline of a projection of an entire structure formed by a lower electrode layer, a dielectric layer and an upper electrode layer in the capacitor structure CAP on the top surface of the substrate is a rectangle or a rounded rectangle. In an example, an outline of a projection of the transistor structure TR on the top surface of the substrate is in a shape of a rectangle or a rounded rectangle. The outline of the projection of the transistor structure TR on the top surface of the substrate being in a shape of a rectangle or a rounded rectangle means that a shape of an outline of a projection of an entire structure formed by a channel layer, a gate layer, a source region and a drain region in the transistor structure TR on the top surface of the substrate is a rectangle or a rounded rectangle. In this specific embodiment, the memory cells are isolated from each other and supported by the isolation walls 10, so that any of the memory cells has a regular shape. In an example, the shape of the outline of the projection of the memory cell on the top surface of the substrate is a rectangle or a rounded rectangle. In this specific embodiment, the memory cells are isolated from each other and supported by the isolation walls 10, so that the shape of the outline of the projection of the capacitor structure in any memory cell on the top surface of the substrate is a regular rectangle or a regular rounded rectangle (or the shape of the outline of the projection of each of the capacitor structure and the transistor structure in the memory cell on the top surface of the substrate is a regular rectangle or a regular rounded rectangle), so as to simplify the manufacturing process of the memory cell, and to improve the consistency of the morphologies of memory cells, thereby improving the consistency of the electrical performances of memory cells in the semiconductor structure, and thus improving the performance stability of the semiconductor structure. In this specific embodiment, the term "rounded rectangle" refers to a rectangle having at least one circular-arc-shaped interior corner.

The transistor structure TR being aligned with the capacitor structure CAP in the third direction D3 means that a central axis of the transistor structure TR extending in the third direction D3 is aligned, in the third direction D3, with a central axis of the capacitor structure CAP extending in the third direction D3. The width of the transistor structure TR in the first direction D1 is equal to the width of the capacitor structure CAP in the first direction D1, and the transistor structure TR is aligned with the capacitor structure CAP in the third direction D3, so that the transistor structure TR of regular shape and the capacitor structure CAP of regular shape can be formed in each storage area PM, and the partial manufacturing process of the transistor structure TR is compatible with the partial manufacturing process of capacitor structure CAP, so as to simplify the manufacturing process of the semiconductor structure, and to maximize the utilization of the internal space of the storage area, thereby increasing the capacitance of the capacitor structure CAP, while improving the controllability of the transistor structure TR.

In some embodiments, the stack structure further includes a plurality of isolation layers 16.

Each of the plurality of isolation layers 16 is arranged between any two adjacent memory cells of the plurality of memory cells of a respective one of the plurality of storage areas PM, and each of the plurality of isolation layers 16 is connected to a sidewall of a respective one of the plurality of isolation walls 10.

Specifically, each storage area PM includes the memory cells and the isolation layers 16, the memory cells and the isolation layers are alternately stacked on one another in the second direction D2. On the one hand, the isolation layer 16 may isolate the memory cells which are adjacent to each other in the second direction D2 in the storage area PM, on the other hand, the isolation layer 16 and the isolation wall 10 may collectively support the stack structure, so as to further improve the stability of the stack structure, and to reduce the probability of toppling or collapsing of the semiconductor structure in the manufacturing process.

In some embodiments, a thickness of each of the plurality of isolation layers 16 ranges from 20 nm to 30 nm.

Specifically, the thickness of the isolation layer 16 should not be too small, otherwise the parasitic capacitance effect between the memory cells which are adjacent to each other in the second direction D2 may be increased, or leakage between the memory cells which are adjacent to each other in the second direction D2 may be caused, and the capacitive coupling effect between the adjacent bit lines may be increased. The thickness of the isolation layer 16 should not be too large, otherwise the dimension of the semiconductor structure may be increased. In order to further reduce the dimension of the semiconductor structure while reducing the parasitic capacitance effect in the semiconductor structure, in this specific embodiment, the thickness of the isolation layer 16 in the second direction D2 ranges from 20 nm to 30 nm. In an example, the thickness of the isolation layer 16 in the second direction D2 is 25 nm.

In order to improve the stability of the connection between the isolation layer 16 and the isolation wall 10 to further stably support the stack structure, in an embodiment, the material of the isolation layer 16 is the same as the material of the isolation wall 10. In an example, the material of the isolation layer 16 and the material of the isolation wall 10 are both oxide materials, such as silicon dioxide.

In some embodiments, the semiconductor structure further includes a plurality of word lines 60. Each of the plurality of word lines 60 is arranged in a respective one of the plurality of storage areas PM and extends in the second direction D2, and the plurality of word lines 60 are spaced apart from each other in the first direction D1. The transistor structure includes: a gate layer 11, a channel layer 20, a source region and a drain region.

The channel layer 20 is arranged around a periphery of the gate layer 11. An outline of a projection of the channel layer 20 on the top surface of the substrate is in a shape of a rectangle or a rounded rectangle, and each of the plurality of word lines 60 is connected with gate layers 11 which are adjacent to each other in the second direction D2 in the respective one of the plurality of storage areas PM.

The source region is arranged at an end of the channel layer 20 in the third direction D3, and the drain region is arranged at an opposite end of the channel layer 20 in the third direction D3.

Figure 6:
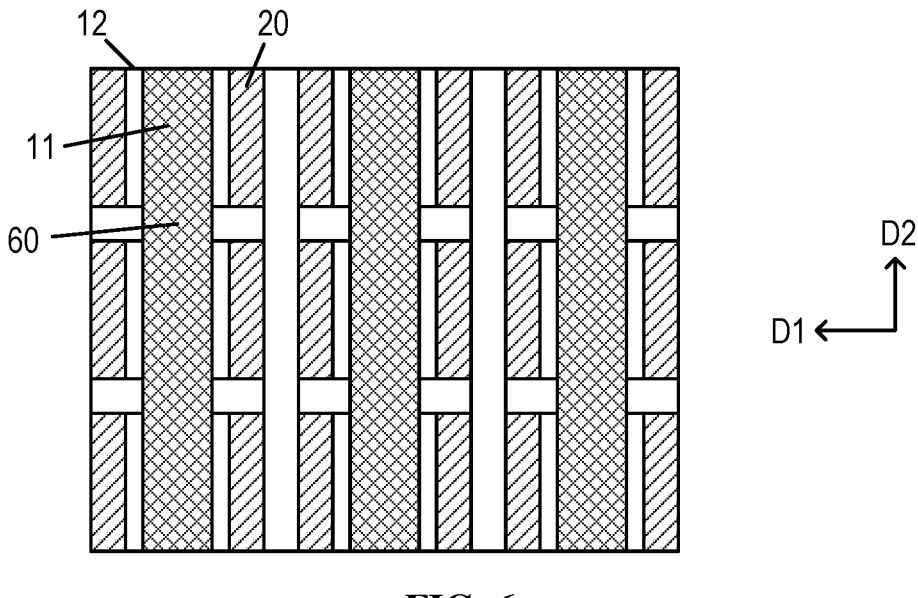
FIG. 6 is a cross-sectional view taken along the a-a position in FIG. 2.
Figures 7, 8:
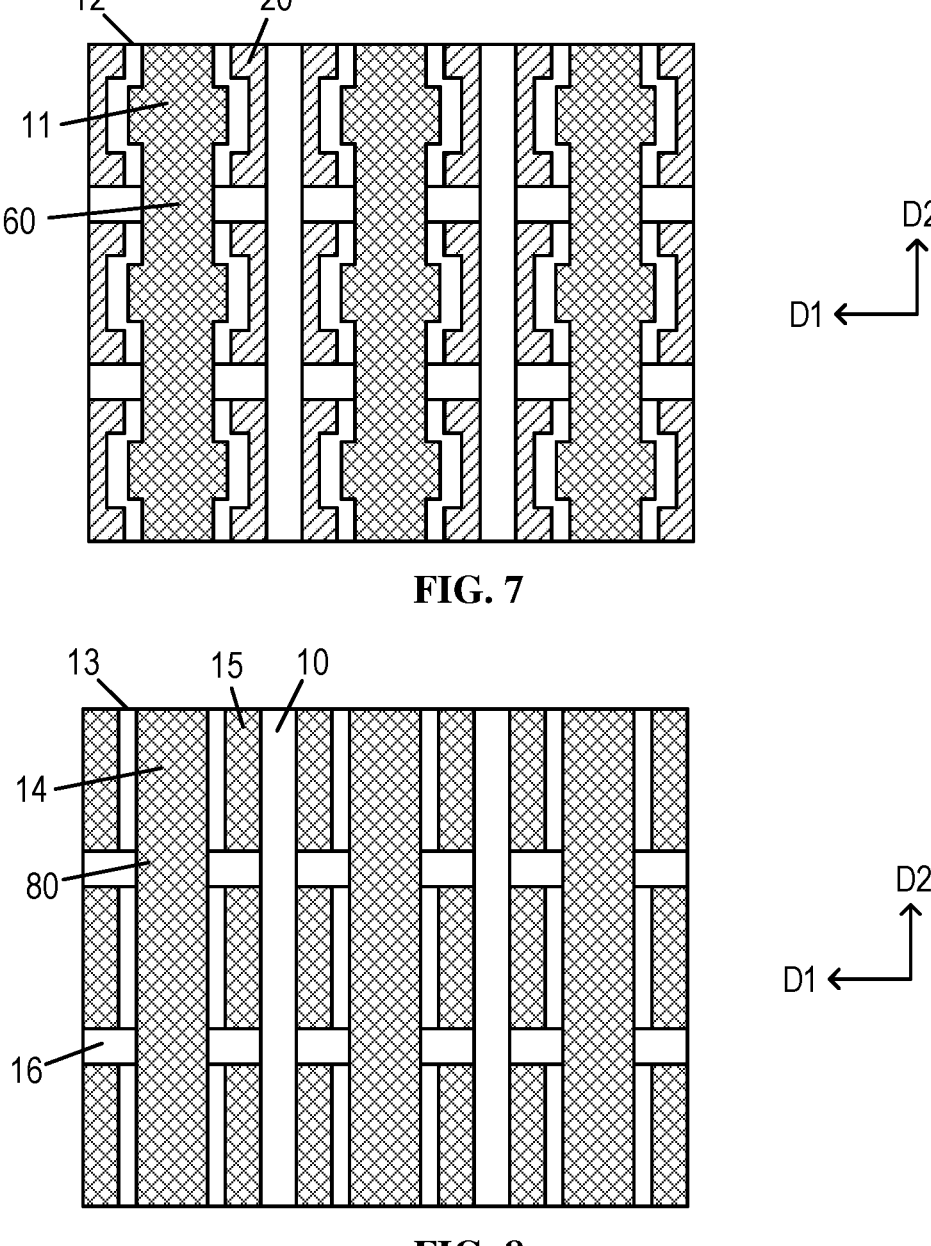
FIG. 7 is another cross-sectional view taken along the a-a position in FIG. 2.
FIG. 8 is a cross-sectional view taken along the b-b position in FIG. 4.

FIG. 6 is a cross-sectional view taken along the a-a position in FIG. 2. FIG. 7 is another cross-sectional view taken along the a-a position in FIG. 2. Specifically, the transistor structure TR includes the gate layer 11, the gate dielectric layer 12 surrounding and covering the surface of the gate layer 11, the channel layer 20 surrounding and covering the surface of the gate dielectric layer 12, the source region arranged at an end of the channel layer 20 in the third direction D3, and the drain region arranged at an opposite end of the channel layer 20 in the third direction D3, so as to form a channel all-around structure, and the drain region directly contacts and is electrically connected to the capacitor structure CAP. The materials of the channel layer 20, the source region and the drain region may all be silicon materials.

In some embodiments, in a direction parallel to the top surface of the substrate, a width of the gate layer 11 is greater than or equal to a width of each of the plurality of word lines 60.

Specifically, in some embodiments, in order to reduce the influence of the short channel effect, in a direction parallel to the top surface of the substrate (for example, the first direction D1 and the third direction D3), the width of the gate layer 11 is greater than the width of the word line 60. In some other embodiments, in order to simplify the manufacturing process of the semiconductor, in a direction parallel to the top surface of the substrate (for example, the first direction D1 and the third direction D3), the width of the gate layer 11 is equal to the width of the word line 60.

In some other embodiments, the semiconductor structure further includes a plurality of word lines 60. Each of the plurality of word lines 60 is arranged in a respective one of the plurality of storage areas PM and extends in the second direction D2, and the plurality of word lines 60 are spaced apart from each other in the first direction D1. The transistor structure includes: a gate layer 11, a channel layer 20, a source region and a drain region.

The gate layer 11 is arranged around a periphery of the channel layer 20. An outline of a projection of the gate layer 11 on the top surface of the substrate is in a shape of a rectangle or a rounded rectangle, and each of the plurality of word lines 60 is connected with gate layers 11 which are adjacent to each other in the second direction D2 in the respective one of the plurality of storage areas PM.

The source region is arranged at an end of the channel layer 20 in the third direction D3, and the drain region is arranged at an opposite end of the channel layer 20 in the third direction D3.

Specifically, the transistor structure TR includes the channel layer 20, the gate dielectric layer 12 surrounding and covering the surface of the channel layer 20, the gate layer 11 covering the surface of the gate dielectric layer 12, the source region arranged at an end of the channel layer 20 in the third direction D3, and the drain region arranged at an opposite end of the channel layer 20 in the third direction D3, so as to form a gate all-around structure, and the drain region directly contacts and is electrically connected to the capacitor structure CAP. The materials of the channel layer 20, the source region and the drain region may all be silicon materials.

In order to avoid the generation of an inversion layer within the transistor structure TR, in some embodiments, the transistor structure TR further includes a gate dielectric layer 12 arranged between the gate layer 11 and the channel layer 20. A thickness of the gate dielectric layer 12 is greater than 10 nm.

In order to simplify the manufacturing process of the semiconductor structure, in some embodiments, as shown in FIG. 1 and FIG. 2, the capacitor structure CAP includes: an upper electrode layer 14, a dielectric layer 13, and a lower electrode layer 15.

The dielectric layer 13 is arranged around a periphery of the upper electrode layer 14.

The lower electrode layer 15 is arranged around a periphery of the dielectric layer 13. The lower electrode layer 15 is electrically connected to the transistor structure TR, and an outline of a projection of the lower electrode layer 15 on the top surface of the substrate is in a shape of a rectangle or a rounded rectangle.

Specifically, the capacitor structure CAP includes the lower electrode layer 15, the dielectric layer 13, and the upper electrode layer 14. The lower electrode layer 15 is electrically connected to the drain region in the transistor structure TR, and the lower electrode layer 15 has a rectangular ring structure or a rounded rectangular ring structure. The dielectric layer 13 is arranged between the upper electrode layer 14 and the lower electrode layer 15. The upper electrode layer 14 and the lower electrode layer 15 may be made of the same material, such as metal tungsten or TiN.

Figures 3, 4:
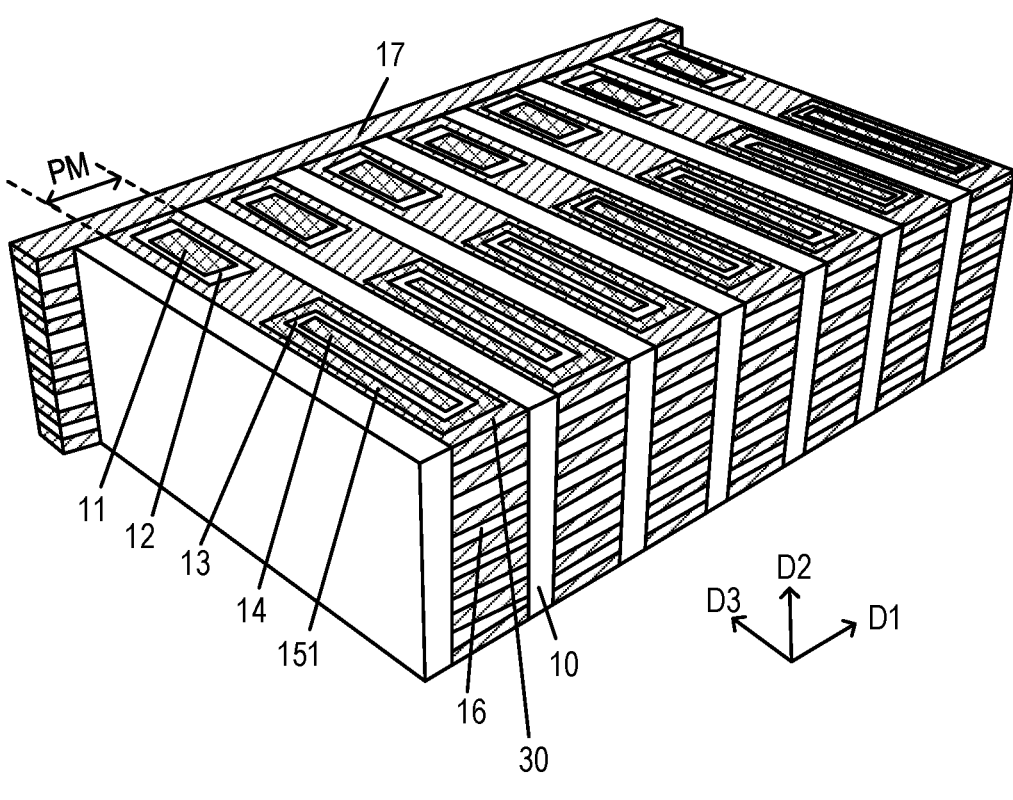
FIG. 3 is a stereoscopic diagram of a semiconductor structure according to a second embodiment of specific embodiments of the disclosure.
FIG. 4 is a top view of FIG. 3.

FIG. 3 is a stereoscopic diagram of a semiconductor structure according to a second embodiment of a specific embodiment of the disclosure. FIG. 4 is a top view of FIG. 3. In some other embodiments, as shown in FIG. 3 and FIG. 4, the capacitor structure includes: an upper electrode layer 14, a dielectric layer 13, and a lower electrode layer.

The dielectric layer 13 is arranged around a periphery of the upper electrode layer 14.

The lower electrode layer includes a first conductive layer 151 arranged around a periphery of the dielectric layer 13, and a second conductive layer 30 arranged around a periphery of the first conductive layer 151. The second conductive layer 30 is electrically connected to the transistor structure TR, and an outline of a projection of the second conductive layer 30 on the top surface of the substrate is in a shape of a rectangle or a rounded rectangle.

In some embodiments, the drain region in the transistor structure TR is integrally formed with the second conductive layer 30.

In some embodiments, a material of the first conductive layer 151 is different from a material of the second conductive layer 30, and the material of the second conductive layer 30 is a silicon material containing doped ions.

For example, the capacitor structure CAP includes the lower electrode layer, the dielectric layer 13, and the upper electrode layer 14. The dielectric layer 13 covers the surface of the upper electrode layer 14, the lower electrode layer covers the surface of the dielectric layer 13 away from the upper electrode layer 14, and the lower electrode layer includes the first conductive layer 151 and the second conductive layer 30. The first conductive layer 151 and the upper electrode layer 14 may be made of the same material, such as metal tungsten or TiN. The second conductive layer 30 is electrically connected to the drain region in the transistor structure TR. The drain region in the transistor structure TR is integrally formed with the second conductive layer 30, so that on the one hand, the formation process of the drain region in the transistor structure TR may be compatible with the formation process of the second conductive layer 30 in the capacitor structure CAP, so as to simplify the manufacturing process of the semiconductor structure; on the other hand, the contact area between the second conductive layer 30 and the drain region may be enlarged, and the contact resistance between the transistor structure TR and the capacitor structure CAP may be reduced. The material of the second conductive layer 30 is a silicon material containing doped ions, so as to reduce the contact resistance between the second conductive layer 30 and the drain region in the transistor structure TR, while enhancing the conductivity of the second conductive layer 30. In this specific embodiment, the drain region in the transistor structure TR being integrally formed with the second conductive layer 30 means that there is no contact interface between the drain region and the second conductive layer 30.

In some embodiments, the capacitor structure CAP includes: an upper electrode layer 14, a dielectric layer 13, and a lower electrode layer.

A projection of the upper electrode layer 14 on the top surface of the substrate is in a long strip shape, and the upper electrode layer 14 extends in the third direction D3.

The dielectric layer 13 is arranged around a periphery of the upper electrode layer 14, and an outline of a projection of the dielectric layer 13 on a top surface of the substrate is in a shape of a rectangle or a rounded rectangle.

The lower electrode layer is arranged around a periphery of the dielectric layer 13. The lower electrode layer is electrically connected to the transistor structure TR, and an outline of a projection of the lower electrode layer on the top surface of the substrate is in a shape of a rectangle or a rounded rectangle.

For example, as shown in FIG. 3 and FIG. 4, the projection of the upper electrode layer 14 in the memory cell on the top surface of the substrate is in a long strip shape. Outlines of projections of the dielectric layer 13 and the first conductive layer 151 and the second conductive layer 30 in the lower electrode layer on the top surface of the substrate each are in a shape of a rectangle or a rounded rectangle, so as to simplify the manufacturing process of the semiconductor structure, and to reduce the manufacturing cost of the semiconductor structure.

Figure 5:
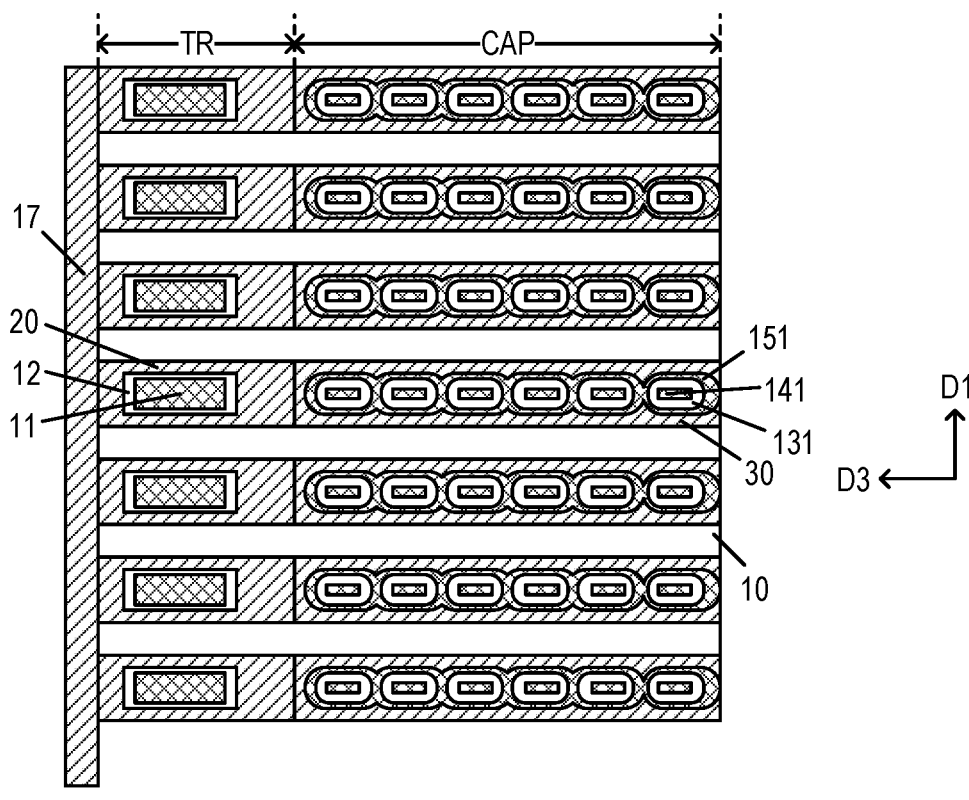
FIG. 5 is a stereoscopic diagram of a semiconductor structure according to a third embodiment of specific embodiments of the disclosure.

FIG. 5 is a top diagram of a semiconductor structure according to a third embodiment of specific embodiments of the disclosure. In some other embodiments, as shown in FIG. 5, the capacitor structure CAP includes: an upper electrode layer, a dielectric layer, and a lower electrode layer.

The upper electrode layer includes a plurality of sub-upper electrode layers 141 spaced apart from each other in the third direction D3.

The dielectric layer includes a plurality of sub-dielectric layers 131 spaced apart from each other in the third direction D3, and each of the plurality of sub-dielectric layers 131 is arranged around a periphery of a respective one of the plurality of sub-upper electrode layers 141.

The lower electrode layer extends in the third direction D3 and continuously covers peripheries of the plurality of sub-dielectric layers 131 which are spaced apart from each other in the third direction D3, the lower electrode layer is electrically connected to the transistor structure TR, and an outline of a projection of the lower electrode layer on the top surface of the substrate is in a shape of a rectangle or a rounded rectangle.

Specifically, the capacitor structure CAP includes the patterned upper electrode layer, the dielectric layer, and the lower electrode layer. The lower electrode layer includes the first conductive layer 151, and the second conductive layer covering the surface of the first conductive layer 151. The patterned upper electrode layer includes the plurality of sub-upper electrode layers 141 spaced apart from each other in the third direction D3, and a spacing width between any two adjacent sub-upper electrode layers 141 in the third direction D3 is less than a spacing distance between two capacitor structures CAP which are adjacent to each other in the second direction D2 in the storage area PM, so as to avoid the connection of the first conductive layers 151 within the two capacitor structures CAP which are adjacent to each other in the second direction D2, while forming the first conductive layer 151 extending in the third direction D3 and continuously covering the surface of each of the plurality of sub-dielectric layers 131. The patterned upper electrode layer is used, which is beneficial to improve the efficiency of the capacitor structure CAP, and increase the capacitance of the capacitor structure CAP.

FIG. 8 is a cross-sectional view taken along the b-b position in FIG. 4. FIG. 9 is another cross-sectional view taken along the b-b position in FIG. 4. In some embodiments, as shown in FIG. 8 and FIG. 9, the capacitor structure CAP includes a common electrode layer 80.

The common electrode layer 80 is arranged in a respective one of the plurality of storage areas PM. The common electrode layer 80 extends in the second direction D2, and is connected with upper electrode layers 14 which are adjacent to each other in the second direction D2.

In a direction parallel to the top surface of the substrate, a width of the common electrode layer 80 is less than or equal to a width of the upper electrode layer 14.

For example, as shown in FIG. 8 and FIG. 9, the common electrode layer 80 extends in the second direction D2 and is continuously connected with the plurality of upper electrode layers 14 which are spaced apart from each other in the second direction D2 in the storage area PM. In an example, in the direction parallel to the top surface of the substrate (for example, the first direction D1 and the third direction D3), the width of the common electrode layer 80 is equal to the width of the upper electrode layer 14, so as to simplify the manufacturing process of the semiconductor structure. In another example, in the direction parallel to the top surface of the substrate (for example, the first direction D1 and the third direction D3), the width of the common electrode layer 80 is less than the width of the upper electrode layer 14, so as to increase the overlap area between the upper electrode layer 14 and the lower electrode layer, thereby increasing the capacitance of the capacitor structure.

In some embodiments, the semiconductor structure further includes a plurality of bit lines 17.

The plurality of bit lines 17 are spaced apart from each other in the second direction D2. Each of the plurality of bit lines 17 is electrically connected to transistor structures TR which are spaced apart from each other in the first direction D1, and a material of each of the plurality of bit lines 17 is a silicon material containing doped ions.

In some embodiments, the source region in each of the transistor structures TR is integrally formed with a respective one of the plurality of bit lines 17.

Specifically, the plurality of bit lines 17 are spaced apart from each other in the second direction D2. The isolation layer 16 is provided between any two bit lines 17 adjacent to each other in the second direction D2, so as to electrically isolate the adjacent bit lines 17. Each bit line 17 extends in the first direction D1, and is continuously electrically connected to the source regions of the transistor structures TR spaced apart from each other in the first direction D1. The source region in the transistor structure TR is integrally formed with the second conductive layer 30, so that on the one hand the formation process of the source region in the transistor structure may be compatible with the formation process of the bit line 17, so as to simplify the manufacturing process of the semiconductor structure, and on the other hand the contact area between the bit line 17 and the source region may be enlarged, and the contact resistance between the transistor structure TR and the bit line 17 may be reduced. The bit line 17 and the source region may be made of the same material, such as a silicon material containing doped ions.

This specific embodiment further provides a method for forming a semiconductor structure. FIG. 10 is a flow chart of a method for forming a semiconductor structure according to a specific embodiment of the disclosure. FIG. 11 to FIG. 23 are schematic diagrams of main process structures during forming a semiconductor structure according to a specific embodiment of the disclosure. FIG. 1 to FIG. 9 show the schematic diagrams of the formed semiconductor structure in this specific embodiment. The semiconductor structure in this specific embodiment may be, but is not limited to, DRAM. As shown in FIG. 1 to FIG. 23, the method for forming the semiconductor structure includes the following operations.

In S101, a substrate is provided.

In S102, a stack structure is formed on the substrate, in which the stack structure includes a plurality of storage areas PM spaced apart from each other in a first direction D1, and a plurality of isolation walls 10, each of the plurality of isolation walls 10 being arranged between any two adjacent storage areas of the plurality of storage areas PM, in which each of the plurality of storage areas PM includes a plurality of memory cells spaced apart from each other in a second direction D2, each of the plurality of memory cells including a transistor structure TR, and a capacitor structure CAP arranged on a side surface of the transistor structure TR in a third direction D3 and electrically connected to the transistor structure TR, an outline of a projection of the capacitor structure CAP on a top surface of the substrate being in a shape of a rectangle or a rounded rectangle, width of the transistor structure TR being equal to a width of the capacitor structure CAP in the first direction D1, and the transistor structure TR being aligned with the capacitor structure CAP in the third direction D3, in which each of the first direction D1 and the third direction D3 is parallel to the top surface of the substrate, the second direction D2 is perpendicular to the top surface of the substrate, and the first direction D1 intersects with the third direction D3.

In some embodiments, the operation that the stack structure is formed on the substrate includes the following operations.

Figure 11:
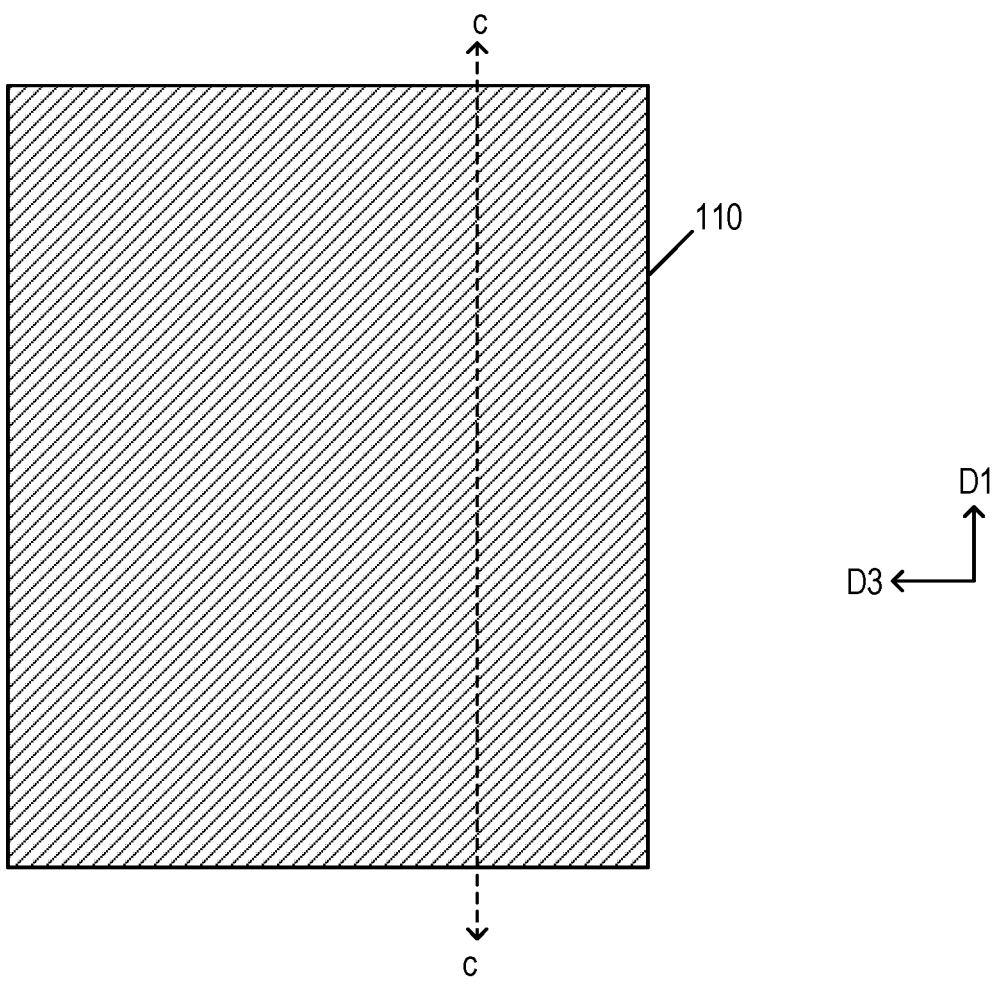
FIG. 11 to FIG. 23 are schematic diagrams of main process structures during forming a semiconductor structure according to a specific embodiment of the disclosure.
Figure 12:
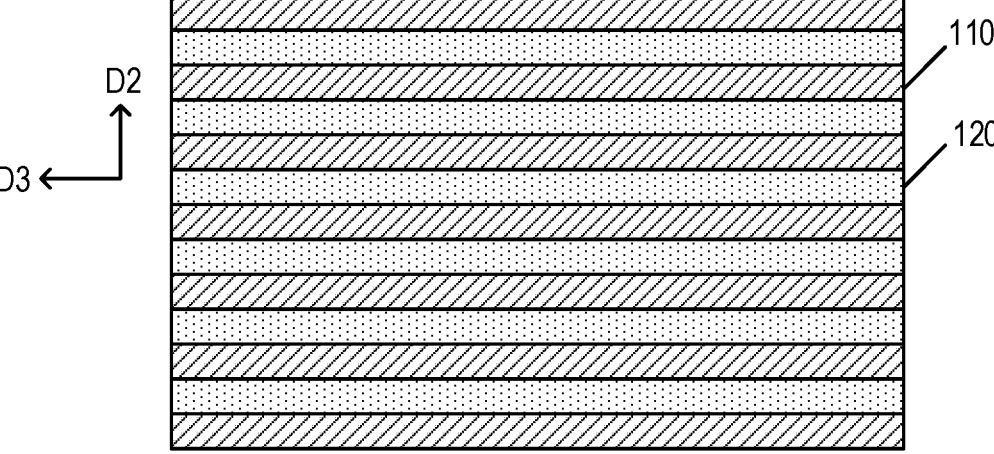

A stack layer is formed on the substrate, in which the stack layer includes a plurality of semiconductor layers 110 spaced apart from each other in the second direction D2, as shown in FIG. 11 which is a top view in the formation process of the semiconductor structure and in FIG. 12 which is a cross-sectional view taken along the c-c position in FIG. 11.

Figure 13:
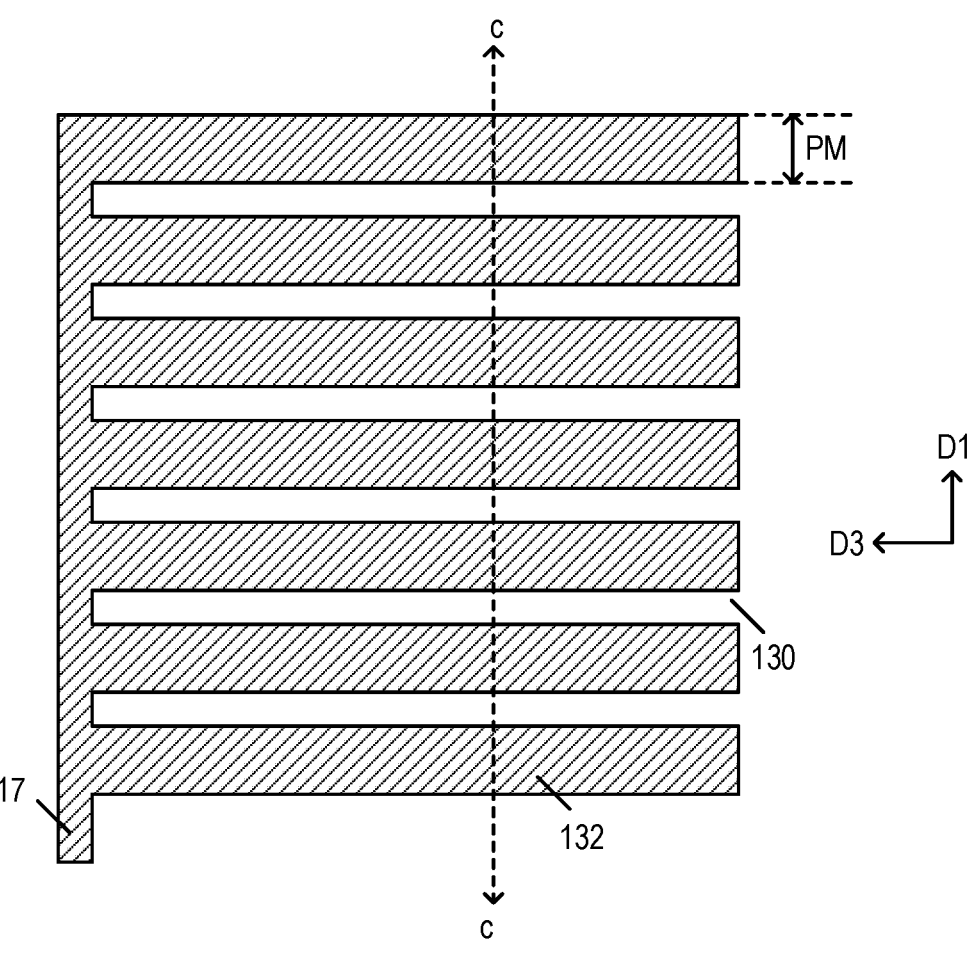
Figure 14:
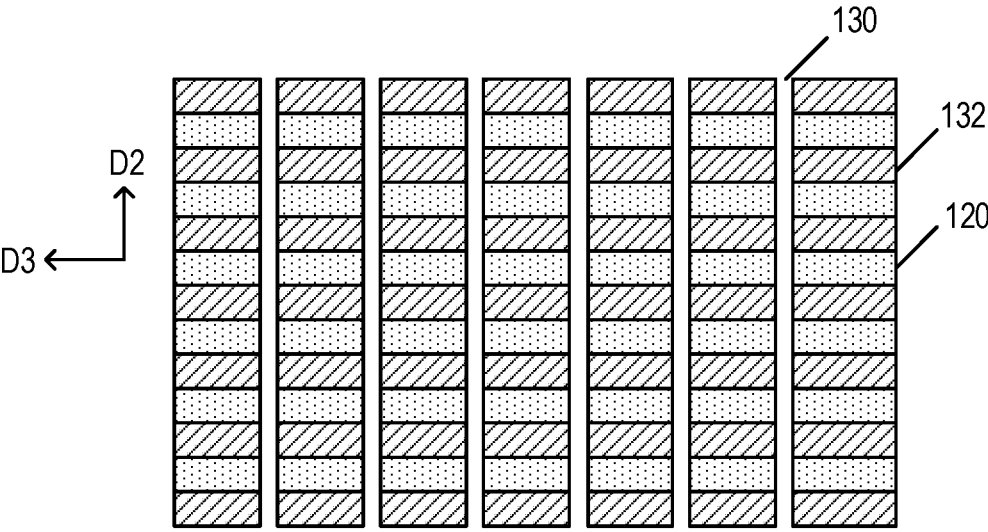

The stack layer is etched to form a plurality of first trenches 130 which penetrate through the stack layer in the second direction D2, in which the stack layer is divided by the plurality of first trenches 130 into the plurality of storage areas PM spaced apart from each other in the first direction D1, as shown in FIG. 13 which is a top view in the formation process of the semiconductor structure, and in FIG. 14 which is a cross-sectional view taken along the c-c position in FIG. 13.

Figure 15:
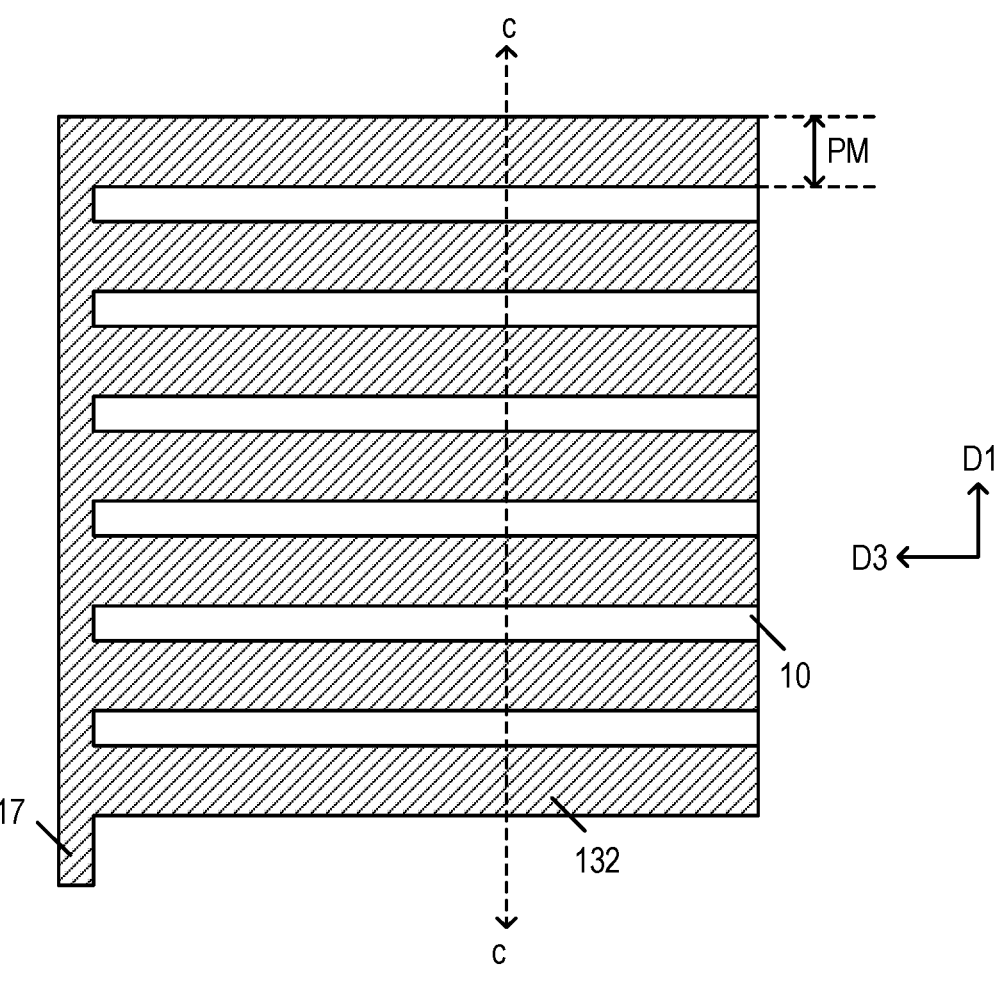
Figure 16:
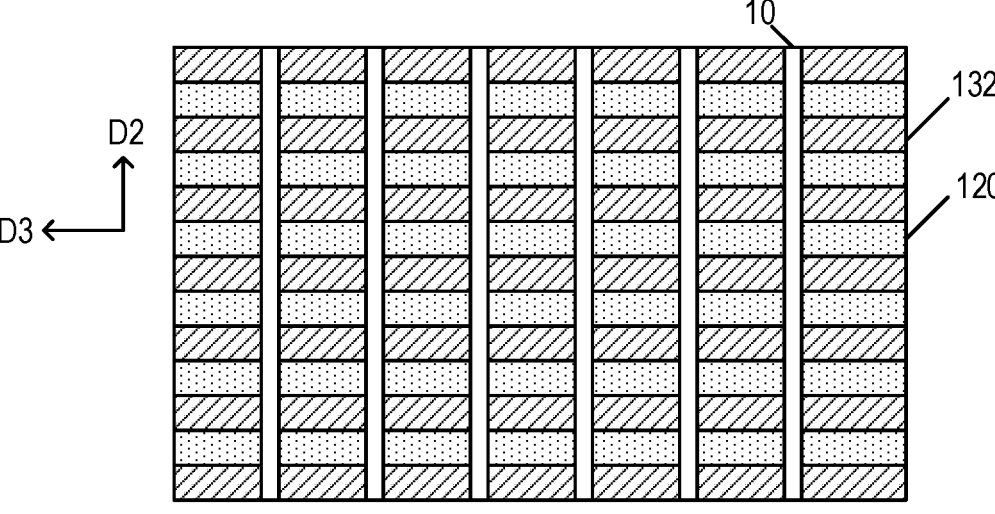

The plurality of first trenches 130 are filled with a first dielectric material to form the plurality of isolation walls 10, as shown in FIG. 15 which is a top view in the formation process of the semiconductor structure, and in FIG. 16 which is a cross-sectional view taken along the c-c position in FIG. 15.

The plurality of memory cells which are spaced apart from each other in the second direction D2 are formed in each of the plurality of storage areas PM.

In some embodiments, the operation that the plurality of first trenches 130 which penetrate through the stack layer in the second direction D2 are formed includes the following operation.

The stack layer is etched in the third direction D3 to form the plurality of first trenches 130 which do not completely penetrate through the stack layer in the third direction D3, in which a portion of each of the plurality of semiconductor layers 110 remained at an end of the stack layer in the third direction D3 forms a bit line 17.

Specifically, the semiconductor layers 110 and the sacrificial layers 120 may be alternately epitaxially grown on the top surface of the substrate in the second direction D2, so as to form the stack layer with a superlattice stack structure, as shown in FIG. 11 and FIG. 12. The etch selectivity ratio of the semiconductor layer 110 to the sacrificial layer 120 should be relatively high, so as to subsequently selectively remove the sacrificial layer 120. In an example, the material of the semiconductor layer 110 is a silicon material, and the material of the sacrificial layer 120 is a SiGe material. The thickness of the semiconductor layer 110 in the second direction D2 may be 30 nm, and the thickness of the sacrificial layer 120 in the second direction D2 may range from 20 nm to 30 nm. Then, the stack layer may be etched through a photolithographic process, so as to form the plurality of first trenches 130 which penetrate through the stack layer in the second direction D2, and the plurality of first trenches 130 are spaced apart from each other in the first direction D1, so that the stack layer is divided into the plurality of storage areas PM spaced apart from each other in the first direction D1, as shown in FIG. 13 and FIG. 14. The semiconductor layer 110 is divided by the plurality of first trenches 130 into a plurality of rectangular semiconductor blocks 132 spaced apart from each other in the first direction D1. The plurality of first trenches 130 do not completely penetrate through the stack layer in the third direction D3, and a portion of each of the plurality of semiconductor layers 110 remained at an end of the stack layer forms the bit line 17. The first trenches 130 are filled with a first dielectric material, such as an oxide (e.g., silicon dioxide), so as to form the isolation walls 10. On the one hand, the isolation wall 10 is configured to isolate the adjacent storage areas PM from each other, and on the other hand, the isolation wall 10 is configured to support the stack layer, so as to avoid toppling or collapsing of the stack layer in the subsequent process. Then, the memory cell is formed in the semiconductor block 132. In this specific embodiment, the compatibility of the formation process of the isolation wall 10, the formation process of the storage area PM, and the formation process of the bit line 17 helps to further simplify the manufacturing process of the semiconductor structure, thereby improving the manufacturing efficiency of the semiconductor structure.

Figure 17:
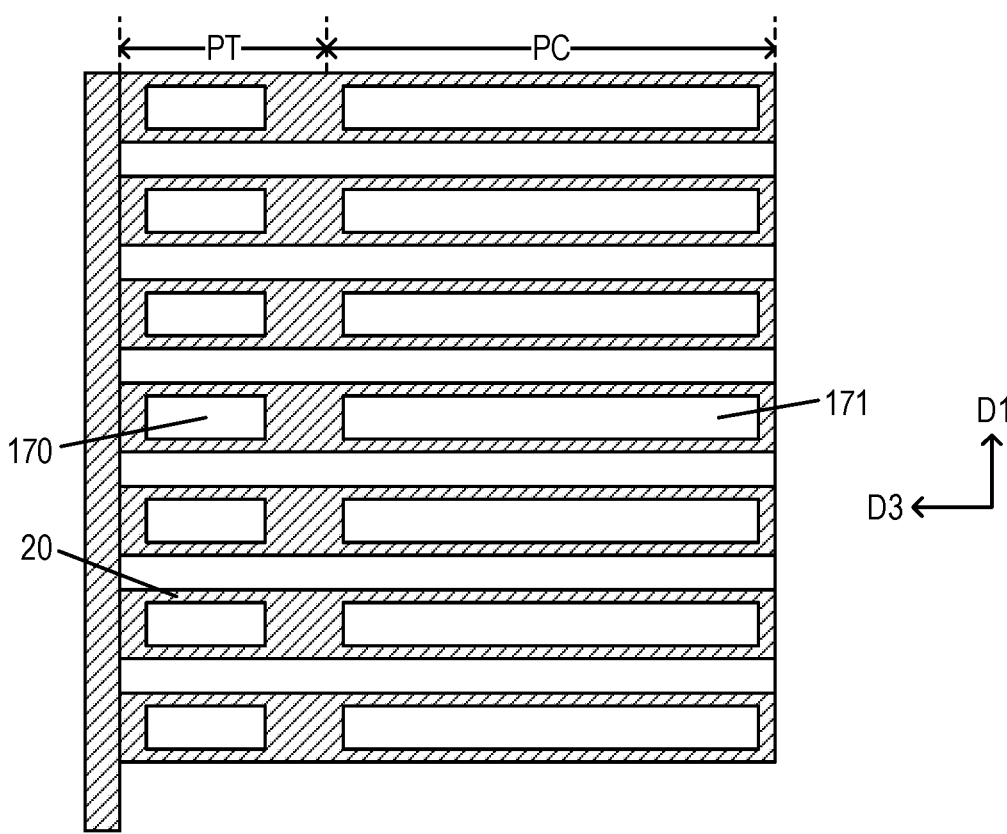

In some embodiments, an outline of a projection of each of the plurality of storage areas PM on the top surface of the substrate is in a shape of a rectangle or a rounded rectangle, and each of the plurality of storage areas PM includes a transistor region PT, and a capacitor region PC arranged outside the transistor region PT in the third direction D3, as shown in FIG. 17. The operation that the plurality of memory cells which are spaced apart from each other in the second direction D2 are formed in each of the plurality of storage areas PM includes the following operations.

The stack layer is etched to form a first opening 170 which penetrates through the stack layer in the transistor region PT in the second direction D2, and to form a second opening 171 which penetrates through the stack layer in the capacitor region PC in the second direction D2, in which a projection of each of the first opening 170 and the second opening 171 on the top surface of the substrate is in a shape of a rectangle or a rounded rectangle, in which a width of the first opening 170 is equal to a width of the second opening 171 in the first direction D1, and the first opening 170 is aligned with the second opening 171 in the third direction D3, and in which a portion of each of the plurality of semiconductor layers 110 remained in the transistor region PT forms a channel layer 20, a source region arranged at an end of the channel layer 20 in the third direction D3, and a drain region arranged at another end of the channel layer 20 in the third direction D3.

A gate layer 11 is formed in the first opening 170.

At least an upper electrode layer 14, and a dielectric layer 13 arranged around a periphery of the upper electrode layer 14 are formed in the second opening 171, as shown in FIG. 1 to FIG. 9.

In some embodiments, the stack layer includes the plurality of semiconductor layers 110 and a plurality of sacrificial layers 120, the plurality of semiconductor layers 110 and the plurality of sacrificial layers 120 are alternately stacked on one another in the second direction D2. After the first opening 170 which penetrates through the stack layer in the transistor region PT in the second direction D2 and the second opening 171 which penetrates through the stack layer in the capacitor region PC in the second direction D2 are formed, the method further includes the following operations.

Figure 18:
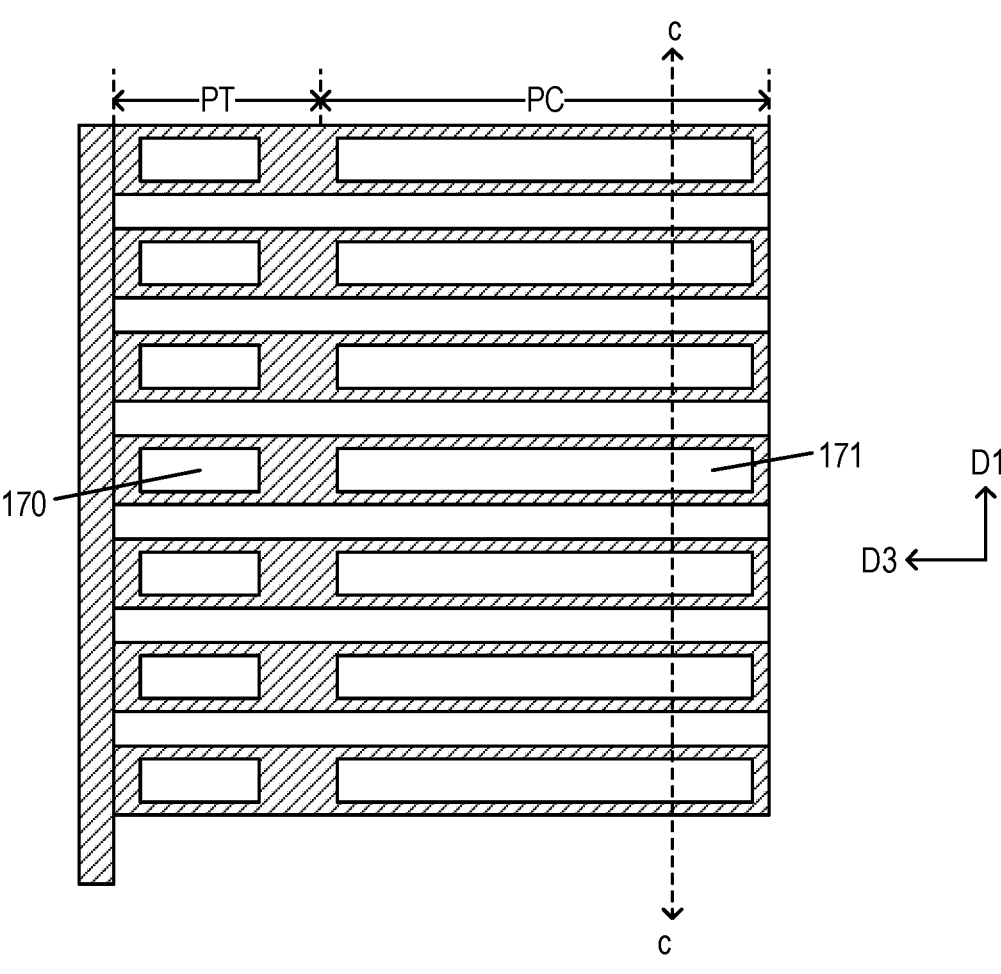
Figure 19:
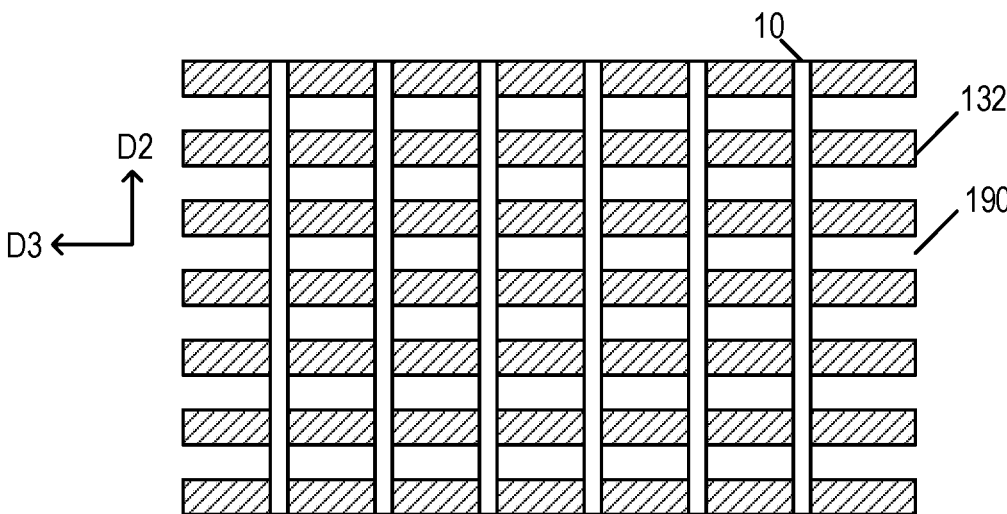

The plurality of sacrificial layers 120 are removed to form a plurality of second trenches 190, in which each of the plurality of second trenches 190 is arranged between any two adjacent semiconductor layers of the plurality of semiconductor layers 110 and exposes the plurality of isolation walls 10, as shown in FIG. 18 which is a top view in the formation process of the semiconductor structure, and in FIG. 19 which is a cross-sectional view taken along the c-c position in FIG. 18.

Figure 20:
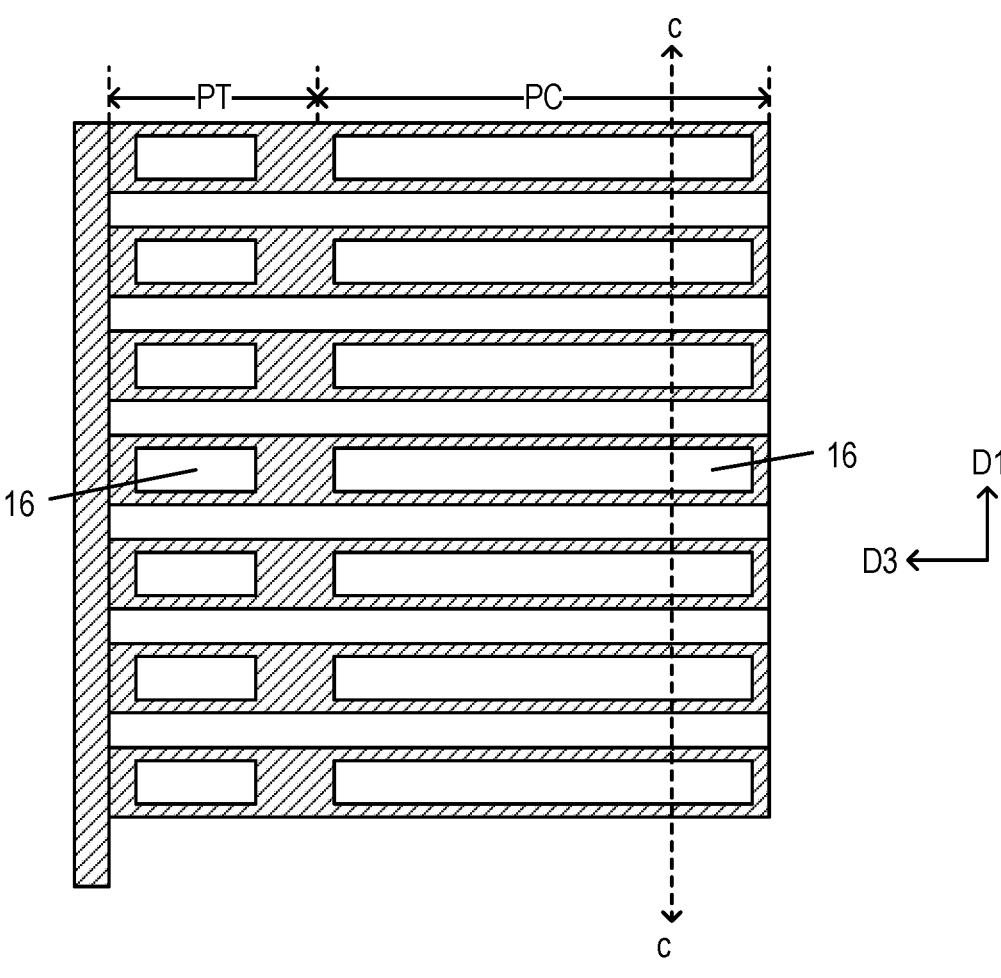
Figure 21:
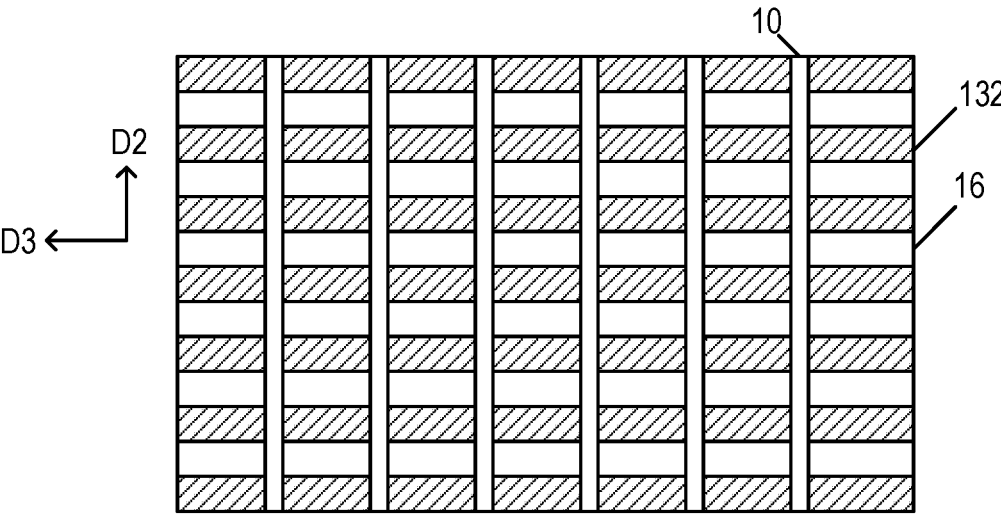

A second dielectric material is deposited in the plurality of second trenches 190 to form a plurality of isolation layers 16, as shown in FIG. 20 which is a top view in the formation process of the semiconductor structure, and in FIG. 21 which is a cross-sectional view taken along the c-c position in FIG. 20.

Specifically, after the isolation wall 10 is formed, the transistor region PT and the capacitor region PC in the storage area PM may be simultaneously etched through a dry etching process. The first opening 170 which penetrates through the semiconductor blocks 132 and the sacrificial layers 120 along the second direction D2 is formed in the transistor region PT, and the second opening 171 which penetrates through the semiconductor blocks 132 and the sacrificial layers 120 along the second direction D2 is formed in the capacitor region PC. In order to simplify the etching process, a projection of each of the first opening 170 and the second opening 171 on the top surface of the substrate is in a shape of a rectangle or a rounded rectangle, the width of the first opening 170 is equal to the width of the second opening 171 in the first direction D1, and the first opening 170 is aligned with the second opening 171 in the third direction D3. After the first opening 170 and the second opening 171 are formed, portions of the semiconductor blocks 132 are remained in the transistor region PT and the capacitor region PC, as shown in FIG. 17. The portion of the semiconductor block 132 remained in the transistor region PT forms a channel layer 20, a source region arranged at an end of the channel layer 20 in the third direction D3, and a drain region arranged at another end of the channel layer 20 in the third direction D3. The portion of the semiconductor block 132 remained in the capacitor region PC may be subsequently completely removed, or may be used to form a capacitor structure.

Next, with the support of the isolation walls 10, all the sacrificial layers 120 in the stack layer are removed through a wet etching process, so as to form the plurality of second trenches 190, in which each of the plurality of second trenches 190 is arranged between any two adjacent semiconductor layers of the plurality of semiconductor layers 110 and exposes the plurality of isolation walls 10. Then, the second dielectric material, such as an oxide (e.g., silicon dioxide) is filled in the plurality of second trenches 190, the first opening 170 and the second opening 171, so as to form the plurality of isolation layers 16.

In some embodiments, the channel layer 20 in the portion of each of the plurality of semiconductor layers 110 remained in the transistor region PT is arranged around a periphery of the first opening 170.

Alternatively, the channel layer 20 in the portion of each of the plurality of semiconductor layers 110 remained in the transistor region PT penetrates through the first opening 170 in the third direction D3.

Specifically, the channel layer 20 in the portion of each of the plurality of semiconductor layers 110 remained in the transistor region PT is arranged around the periphery of the first opening 170, so that the transistor structure of a channel all-around structure may be subsequently formed. The channel layer 20 in the portion of each of the plurality of semiconductor layers 110 remained in the transistor region PT penetrates through the first opening 170 in the third direction D3, so that the transistor structure of a gate all-around structure may be subsequently formed, so as to meet the requirements of different semiconductor structures, thereby improving the manufacturing flexibility of the semiconductor structure.

In some embodiments, the operation that the gate layer 11 is formed in the first opening 170 includes the following operations.

A gate dielectric layer 12 covering a surface of the channel layer 20 is formed along the first opening 170.

A first conductive material is deposited along the first opening 170 to form, in the first opening 170, the gate layer 11 covering a surface of the gate dielectric layer 12, and a word line 60 extending in the second direction D2 and connected with gate layers 11 which are adjacent to each other in the second direction D2.

Figure 22:
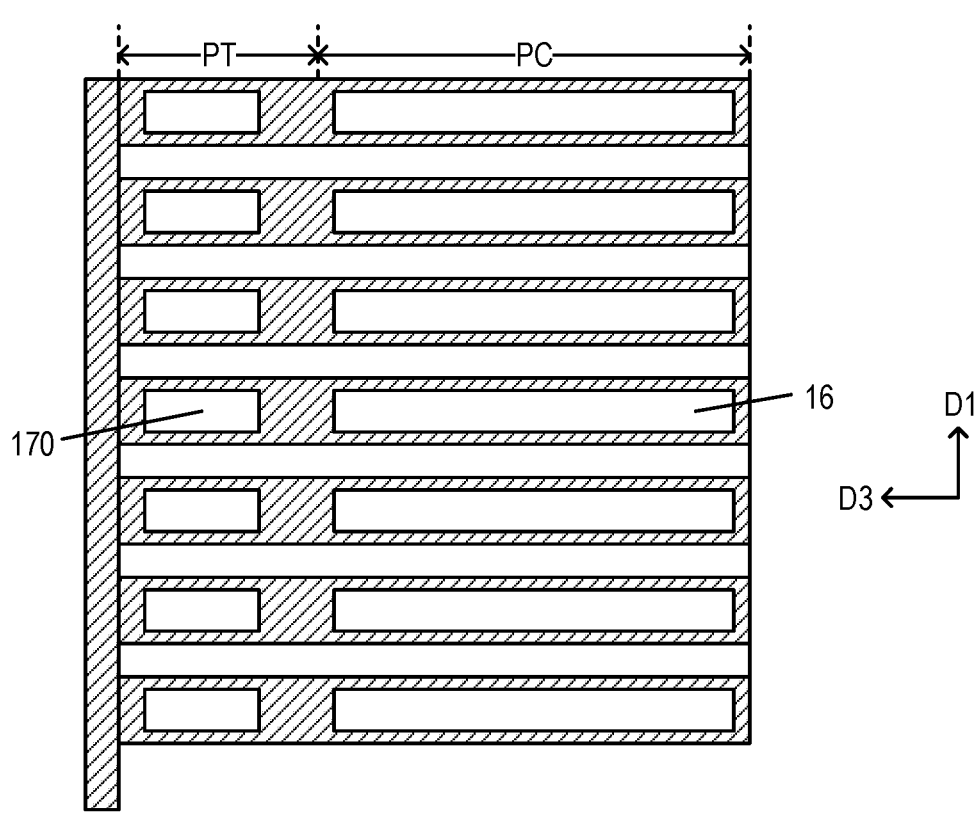

Specifically, the isolation layer 16 in the first opening 170 is removed, as shown in FIG. 22. Then, an oxide (e.g., silicon dioxide) is deposited on an inner wall of the first opening 170, so as to form the gate dielectric layer 12. Next, the first conductive material, such as metal tungsten or TiN, is deposited in the first opening 170 to form the gate layer 11 covering the surface of the gate dielectric layer 12, and the word line 60 extending in the second direction D2 and connected with the gate layers 11 which are adjacent to each other in the second direction D2, as shown in FIG. 1 to FIG. 9, and FIG. 23.

In some embodiments, the operation that at least the upper electrode layer 14, and the dielectric layer 13 arranged around the periphery of the upper electrode layer 14 are formed in the second opening 171 includes the following operations.

Figure 23:
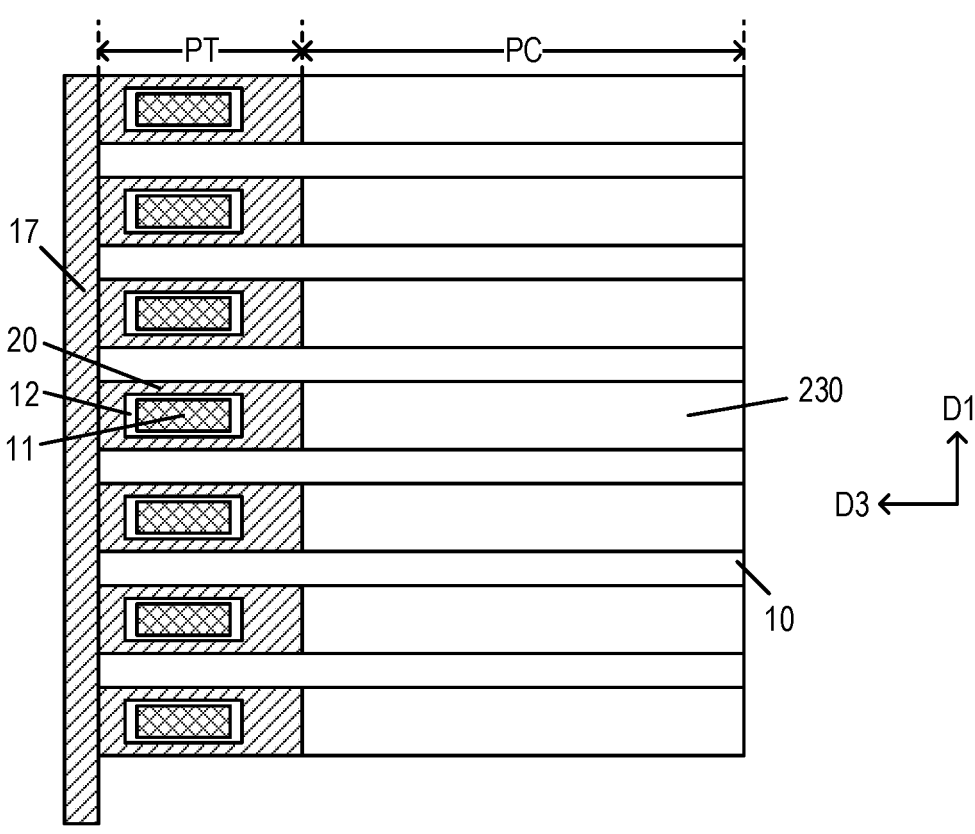

A portion of each of the plurality of semiconductor layers 110 remained in the capacitor region PC is removed along the second opening 171, to form a third opening 230 between any two adjacent isolation layers of the plurality of isolation layers 16 in the capacitor region PC, as shown in FIG. 23.

A lower electrode layer 15 covering an inner wall of the third opening 230 is formed.

The dielectric layer 13 covering a surface of the lower electrode layer 15 is formed in the third opening 230.

The upper electrode layer 14 covering the dielectric layer 13 is formed in the third opening 230, to form the capacitor structure CAP including the lower electrode layer the dielectric layer 13 and the upper electrode layer 14, as shown in FIG. 1 and FIG. 2.

Specifically, all the semiconductor blocks 132 remained in the capacitor region PC may be removed through an etching process, so as to form the third opening 230. Then, the lower electrode layer 15, the dielectric layer 13 and the upper electrode layer 14 are sequentially formed in the third opening 230.

In some embodiments, the operation that at least the upper electrode layer 14, and the dielectric layer 13 arranged around the periphery of the upper electrode layer 14 are formed in the second opening 171 includes the following operations.

Doped ions are injected along the second opening 171 into a portion of each of the plurality of semiconductor layers 110 remained in the capacitor region PC, to form a first conductive layer 30.

A second conductive layer 151 covering a surface of the first conductive layer 30 is formed in the second opening 171.

The dielectric layer 13 covering the second conductive layer 151 is formed in the second opening 171.

The upper electrode layer 14 covering the dielectric layer 13 is formed in the second opening 171, to form the capacitor structure including the first conductive layer 30, the second conductive layer 151, the dielectric layer 13 and the upper electrode layer 14.

Specifically, after the isolation layer 16 in the second opening 171 is removed, the semiconductor blocks 132 remained in the capacitor region PC may not be removed, or only portions of the semiconductor blocks 132 remained in the capacitor region PC may be removed, and doped ions are injected into the semiconductor layers 110 remained in the capacitor region PC, so as to form the first conductive layer 30. The first conductive layer is configured as a portion of the lower electrode layer in the capacitor structure. Then, the second conductive layer 151 covering the first conductive layer 30, the dielectric layer 13 covering the second conductive layer 151, and the upper electrode layer 14 covering the dielectric layer 13 are formed.

According to the semiconductor structure and the method for forming the semiconductor structure provided in some embodiments of this specific embodiment, the isolation wall is provided between any two adjacent storage areas, so that the adjacent storage areas can be electrically isolated from each other, and the stack structure can be supported, without the need for additional support frames and lower electrode isolation structures. Thus, the dimension of the semiconductor structure can be further reduced, while ensuring the stability of the semiconductor structure, and the integration and storage density of the semiconductor structure can be improved. In addition, since there is no support frame in the semiconductor structure, the dimension of the transistor structure (in particular the gate layer and the channel layer in the transistor structure) is no longer affected by the fluctuation of the manufacturing process of the support frame, thereby improving the controllability of the semiconductor structure manufacturing process, and further improving the yield of the semiconductor structure. In some embodiments of this specific embodiment, the isolation layer is provided between any two adjacent memory cells in the storage area, and the isolation layer is connected to the sidewall of the isolation wall. On the one hand, the adjacent memory cells are isolated from each other by the isolation layer, on the other hand, the isolation layer and the isolation wall collectively support the stack structure, thereby further improving the stability of the stack structure.

In addition, in some embodiments of this specific embodiment, a projection of the capacitor structure in the memory cell on the top surface of the substrate is in a shape of a regular rectangle or rounded rectangle, and the width of the transistor structure is equal to the width of the capacitor structure in the first direction, and the transistor structure is aligned with the capacitor structure in the third direction. On the one hand, it is beneficial to improve the consistency of morphologies of memory cells, so as to improve the consistency of electrical performances of memory cells in the semiconductor structure, thereby improving the performance stability of the semiconductor structure. On the other hand, the space of the storage area can be fully utilized, and there is no need to provide additional isolation structure or support structure in the memory cell, so as to maximize the utilization of the space of the storage area, and thus improve the utilization rate of the internal space of the semiconductor structure, thereby further improving the integration and storage density of the semiconductor structure.

The foregoing descriptions are merely the preferred embodiments of the disclosure. It should be pointed out that a person of ordinary skill in the art may make several improvements and refinements without departing from the principle of the disclosure, and these improvements and refinements shall fall within the protection scope of the disclosure.

The invention claimed is:

1. A semiconductor structure, comprising:
a substrate; and
a stack structure arranged on the substrate, wherein the stack structure comprises a plurality of storage areas spaced apart from each other in a first direction, and a plurality of isolation walls, each of the plurality of isolation walls being arranged between any two adjacent storage areas of the plurality of storage areas, wherein each of the plurality of storage areas comprises a plurality of memory cells spaced apart from each other in a second direction, each of the plurality of memory cells comprising a transistor structure, and a capacitor structure arranged on a side surface of the transistor structure in a third direction and electrically connected to the transistor structure, an outline of a projection of the capacitor structure on a top surface of the substrate being in a shape of a rectangle or a rounded rectangle, wherein a width of the transistor structure is equal to a width of the capacitor structure in the first direction, and the transistor structure is aligned with the capacitor structure in the third direction, and wherein each of the first direction and the third direction is parallel to the top surface of the substrate, the second direction is perpendicular to the top surface of the substrate, and the first direction intersects with the third direction;
wherein the capacitor structure comprises:
an upper electrode layer, wherein the upper electrode layer comprises a plurality of sub-upper electrode layers spaced apart from each other in the third direction;
a dielectric layer, wherein the dielectric layer comprises a plurality of sub-dielectric layers spaced apart from each other in the third direction, and each of the plurality of sub-dielectric layers is arranged around a periphery of a respective one of the plurality of sub-upper electrode layers; and
a lower electrode layer, wherein the lower electrode layer extends in the third direction and continuously covers peripheries the plurality of sub-dielectric layers which are spaced apart from each other in the third direction, the lower electrode layer is electrically connected to the transistor structure, and an outline of a projection of the lower electrode layer on the top surface of the substrate is in a shape of a rectangle or a rounded rectangle.

2. The semiconductor structure according to claim 1, wherein the stack structure further comprises:
a plurality of isolation layers, wherein each of the plurality of isolation layers is arranged between any two adjacent memory cells of the plurality of memory cells of a respective one of the plurality of storage areas, and each of the plurality of isolation layers is connected to a sidewall of a respective one of the plurality of isolation walls,
wherein a thickness of each of the plurality of isolation layers ranges from 20 nm to 30 nm.

3. The semiconductor structure according to claim 1, further comprising a plurality of word lines, wherein each of the plurality of word lines is arranged in a respective one of the plurality of storage areas and extends in the second direction, and the plurality of word lines are spaced apart from each other in the first direction,
wherein the transistor structure comprises:
a gate layer;
a channel layer, wherein the channel layer is arranged around a periphery of the gate layer, an outline of a projection of the channel layer on the top surface of the substrate is in a shape of a rectangle or a rounded rectangle, or wherein the gate layer is arranged around a periphery of the channel layer, an outline of a projection of the gate layer on the top surface of the substrate is in a shape of a rectangle or a rounded rectangle, and wherein each of the plurality of word lines is connected with gate layers which are adjacent to each other in the second direction in the respective one of the plurality of storage areas; and
a source region and a drain region, wherein the source region is arranged at an end of the channel layer in the third direction, and the drain region is arranged at an opposite end of the channel layer in the third direction.

4. The semiconductor structure according to claim 3, wherein in a direction parallel to the top surface of the substrate, a width of the gate layer is greater than or equal to a width of each of the plurality of word lines, and wherein the transistor structure further comprises a gate dielectric layer arranged between the gate layer and the channel layer, wherein a thickness of the gate dielectric layer is greater than 10 nm.

5. The semiconductor structure according to claim 3, wherein the lower electrode layer comprises a first conductive layer extending in the third direction and continuously covering a surface of each of the plurality of sub-dielectric layers, and a second conductive layer arranged around a periphery of the first conductive layer, wherein the second conductive layer is electrically connected to the transistor structure, and an outline of a projection of the second conductive layer on the top surface of the substrate is in a shape of a rectangle or a rounded rectangle.

6. The semiconductor structure according to claim 5, wherein the drain region in the transistor structure is integrally formed with the second conductive layer, and wherein a material of the first conductive layer is different from a material of the second conductive layer, and the material of the second conductive layer is a silicon material containing doped ions.

7. The semiconductor structure according to claim 1, wherein the capacitor structure comprises:

a common electrode layer arranged in a respective one of the plurality of storage areas, wherein the common electrode layer extends in the second direction, and is connected with upper electrode layers which are adjacent to each other in the second direction in the respective one of the plurality of storage areas, wherein in a direction parallel to the top surface of the substrate, a width of the common electrode layer is less than or equal to a width of the upper electrode layer.

8. The semiconductor structure according to claim 3, further comprising:

a plurality of bit lines, wherein the plurality of bit lines are spaced apart from each other in the second direction, each of the plurality of bit lines is electrically connected to transistor structures which are spaced apart from each other in the first direction, and a material of each of the plurality of bit lines is a silicon material containing doped ions.

9. The semiconductor structure according to claim 8, wherein the source region in each of the transistor structures is integrally formed with a respective one of the plurality of bit lines.

10. A method for forming a semiconductor structure, comprising:

providing a substrate; and forming a stack structure on the substrate, wherein the stack structure comprises a plurality of storage areas spaced apart from each other in a first direction, and a plurality of isolation walls, each of the plurality of isolation walls being arranged between any two adjacent storage areas of the plurality of storage areas, wherein each of the plurality of storage areas comprises a plurality of memory cells spaced apart from each other in a second direction, each of the plurality of memory cells comprising a transistor structure, and a capacitor structure arranged on a side surface of the transistor structure in a third direction and electrically connected to the transistor structure, an outline of a projection of the capacitor structure on a top surface of the substrate being in a shape of a rectangle or a rounded rectangle, wherein a width of the transistor structure is equal to a width of the capacitor structure in the first direction, and the transistor structure is aligned with the capacitor structure in the third direction, wherein each of the first direction and the third direction is parallel to the top surface of the substrate, the second direction is perpendicular to the top surface of the substrate, and the first direction intersects with the third direction:

wherein the capacitor structure comprises:

an upper electrode layer, wherein the upper electrode layer comprises a plurality of sub-upper electrode layers spaced apart from each other in the third direction;

a dielectric layer, wherein the dielectric layer comprises a plurality of sub-dielectric layers spaced apart from each other in the third direction, and each of the plurality of sub-dielectric layers is arranged around a periphery of a respective one of the plurality of sub-upper electrode layers; and a lower electrode layer, wherein the lower electrode layer extends in the third direction and continuously covers peripheries the plurality of sub-dielectric layers which are spaced apart from each other in the third direction, the lower electrode layer is electrically connected to the transistor structure, and an outline of a projection of the lower electrode layer on the top surface of the substrate is in a shape of a rectangle or a rounded rectangle.

11. The method for forming the semiconductor structure according to claim 10, wherein forming the stack structure on the substrate comprises:

forming a stack layer on the substrate, wherein the stack layer comprises a plurality of semiconductor layers spaced apart from each other in the second direction;

etching the stack layer to form a plurality of first trenches which penetrate through the stack layer in the second direction, wherein the stack layer is divided by the plurality of first trenches into the plurality of storage areas spaced apart from each other in the first direction;

filling the plurality of first trenches with a first dielectric material to form the plurality of isolation walls; and forming, in each of the plurality of storage areas, the plurality of memory cells which are spaced apart from each other in the second direction.

12. The method for forming the semiconductor structure according to claim 11, wherein forming the plurality of first trenches which penetrate through the stack layer in the second direction comprises:

etching the stack layer in the third direction to form the plurality of first trenches which do not completely penetrate through the stack layer in the third direction, wherein a portion of each of the plurality of semiconductor layers remained at an end of the stack layer in the third direction forms a bit line.

13. The method for forming the semiconductor structure according to claim 11, wherein an outline of a projection of each of the plurality of storage areas on the top surface of the substrate is in a shape of a rectangle or a rounded rectangle, and each of the plurality of storage areas comprises a transistor region, and a capacitor region arranged outside the transistor region in the third direction; and wherein forming, in each of the plurality of storage areas, the plurality of memory cells which are spaced apart from each other in the second direction comprises:

etching the stack layer to form a first opening which penetrates through the stack layer in the transistor region in the second direction, and to form a second opening which penetrates through the stack layer in the capacitor region in the second direction, wherein a projection of each of the first opening and the second opening on the top surface of the substrate is in a shape of a rectangle or a rounded rectangle, wherein a width of the first opening is equal to a width of the second opening in the first direction, and the first opening is aligned with the second opening in the third direction, and wherein a portion of each of the plurality of semiconductor layers remained in the transistor region forms a channel layer, a source region arranged at an end of the channel layer in the third direction, and a drain region arranged at another end of the channel layer in the third direction;

forming a gate layer in the first opening; and forming, in the second opening, at least an upper electrode layer, and a dielectric layer arranged around a periphery of the upper electrode layer.

14. The method for forming the semiconductor structure according to claim 13, wherein the stack layer comprises the plurality of semiconductor layers and a plurality of sacrificial layers, the plurality of semiconductor layers and the plurality of sacrificial layers being alternately stacked on one another in the second direction, and wherein after forming the first opening which penetrates through the stack layer in the transistor region in the second direction and forming the second opening which penetrates through the stack layer in the capacitor region in the second direction, the method further comprises:

removing the plurality of sacrificial layers to form a plurality of second trenches, wherein each of the plurality of second trenches is arranged between any two adjacent semiconductor layers of the plurality of semiconductor layers and exposes the plurality of isolation walls; and depositing a second dielectric material in the plurality of second trenches to form a plurality of isolation layers.

15. The method for forming the semiconductor structure according to claim 13, wherein the channel layer in the portion of each of the plurality of semiconductor layers remained in the transistor region is arranged around a periphery of the first opening; or wherein the channel layer in the portion of each of the plurality of semiconductor layers remained in the transistor region penetrates through the first opening in the third direction.

16. The method for forming the semiconductor structure according to claim 14, wherein forming the gate layer in the first opening comprises:

forming, along the first opening, a gate dielectric layer covering a surface of the channel layer; and depositing a first conductive material along the first opening to form, in the first opening, the gate layer covering a surface of the gate dielectric layer, and a word line extending in the second direction and connected with gate layers which are adjacent to each other in the second direction.

17. The method for forming the semiconductor structure according to claim 14, wherein forming, in the second opening, at least the upper electrode layer, and the dielectric layer arranged around the periphery of the upper electrode layer comprises:

removing, along the second opening, a portion of each of the plurality of semiconductor layers remained in the capacitor region, to form a third opening between any two adjacent isolation layers of the plurality of isolation layers in the capacitor region;

forming a lower electrode layer covering an inner wall of the third opening;

forming, in the third opening, the dielectric layer covering a surface of the lower electrode layer; and forming, in the third opening, the upper electrode layer covering the dielectric layer, to form the capacitor structure comprising the lower electrode layer, the dielectric layer and the upper electrode layer.

18. The method for forming the semiconductor structure according to claim 14, wherein forming, in the second opening, at least the upper electrode layer, and the dielectric layer arranged around the periphery of the upper electrode layer comprises:

injecting doped ions along the second opening into a portion of each of the plurality of semiconductor layers remained in the capacitor region, to form a first conductive layer;

forming, in the second opening, a second conductive layer covering a surface of the first conductive layer;

forming, in the second opening, the dielectric layer covering the second conductive layer; and forming, in the second opening, the upper electrode layer covering the dielectric layer, to form the capacitor structure comprising the first conductive layer, the second conductive layer, the dielectric layer and the upper electrode layer.

* * * * *